(12) United States Patent (10) Patent No.: US 12,570,935 B2
Kinuta et al. (45) Date of Patent: Mar. 10, 2026

(54) SUBSTRATE CLEANING SOLUTION, AND USING THE SAME, METHOD FOR MANUFACTURING CLEANED SUBSTRATE AND METHOD FOR MANUFACTURING DEVICE

(71) Applicant: Merck Patent GmbH, Darmstadt (DE)

(72) Inventors: Takafumi Kinuta, Kakegawa (JP);
Tatsuro Nagahara, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 31 days.

(21) Appl. No.: 18/007,553

(22) PCT Filed: May 31, 2021

(86) PCT No.: PCT/EP2021/064507
§ 371 (c)(1),
(2) Date: Dec. 1, 2022

(87) PCT Pub. No.: WO2021/245014
PCT Pub. Date: Dec. 9, 2021

(65) Prior Publication Data
US 2023/0235254 A1 Jul. 27, 2023

(30) Foreign Application Priority Data
Jun. 3, 2020 (JP) ................................. 2020-096652

(51) Int. Cl.
*C11D 7/50* (2006.01)
*C11D 7/26* (2006.01)
(Continued)

(52) U.S. Cl.
CPC ............ *C11D 7/5004* (2013.01); *C11D 7/265* (2013.01); *C11D 17/0013* (2013.01); *H01L 21/02057* (2013.01); *C11D 2111/22* (2024.01)

(58) Field of Classification Search
None
See application file for complete search history.

(56) References Cited

U.S. PATENT DOCUMENTS

2013/0303420 A1 11/2013 Cooper et al.
2014/0170405 A1 6/2014 Makino et al.
(Continued)

FOREIGN PATENT DOCUMENTS

EP 2031050 A1 * 3/2009 ......... C11D 11/0017
EP 2479615 A1 7/2012
(Continued)

OTHER PUBLICATIONS

International Search Report and Written Opinion received for PCT Patent Application No. PCT/EP2021/064507, mailed on Aug. 26, 2021, 11 pages.

*Primary Examiner* — Kaj K Olsen
*Assistant Examiner* — Arlyn I Rivera-Cordero
(74) *Attorney, Agent, or Firm* — Faegre Drinker Biddle & Reath LLP

(57) ABSTRACT

[Problem] To obtain a substrate cleaning solution capable of cleaning a substrate and removing particles. [Means for Solution] To provide a substrate cleaning solution comprising an insoluble or hardly soluble solute (A), a soluble solute (B), and a solvent (C), wherein the solvent (C) comprises water (C-1); and the content of the soluble solute (B) is 0.1 to 500 mass % based on water (C-1).

16 Claims, 1 Drawing Sheet

(51) Int. Cl.
    *C11D 17/00*       (2006.01)
    *H01L 21/02*       (2006.01)

(56)           References Cited

U.S. PATENT DOCUMENTS

| | | | |
|---|---|---|---|
| 2019/0172733 A1* | 6/2019 | Yoshida | ............ H01L 21/02057 |
| 2019/0371599 A1* | 12/2019 | Yoshida | ............ H01L 21/67017 |
| 2020/0384510 A1 | 12/2020 | Yoshida et al. | |

FOREIGN PATENT DOCUMENTS

| | | | |
|---|---|---|---|
| JP | 2019-212889 A | 12/2019 | |
| JP | 2019-212890 A | 12/2019 | |
| KR | 10-2019-0137412 A | 12/2019 | |
| KR | 10-2019-0137413 A | 12/2019 | |
| WO | 2018/099835 A1 | 6/2018 | |
| WO | 2018/115043 A1 | 6/2018 | |
| WO | 2018/190278 A1 | 10/2018 | |
| WO | 2019/048393 A1 | 3/2019 | |
| WO | 2019/121480 A1 | 6/2019 | |

* cited by examiner

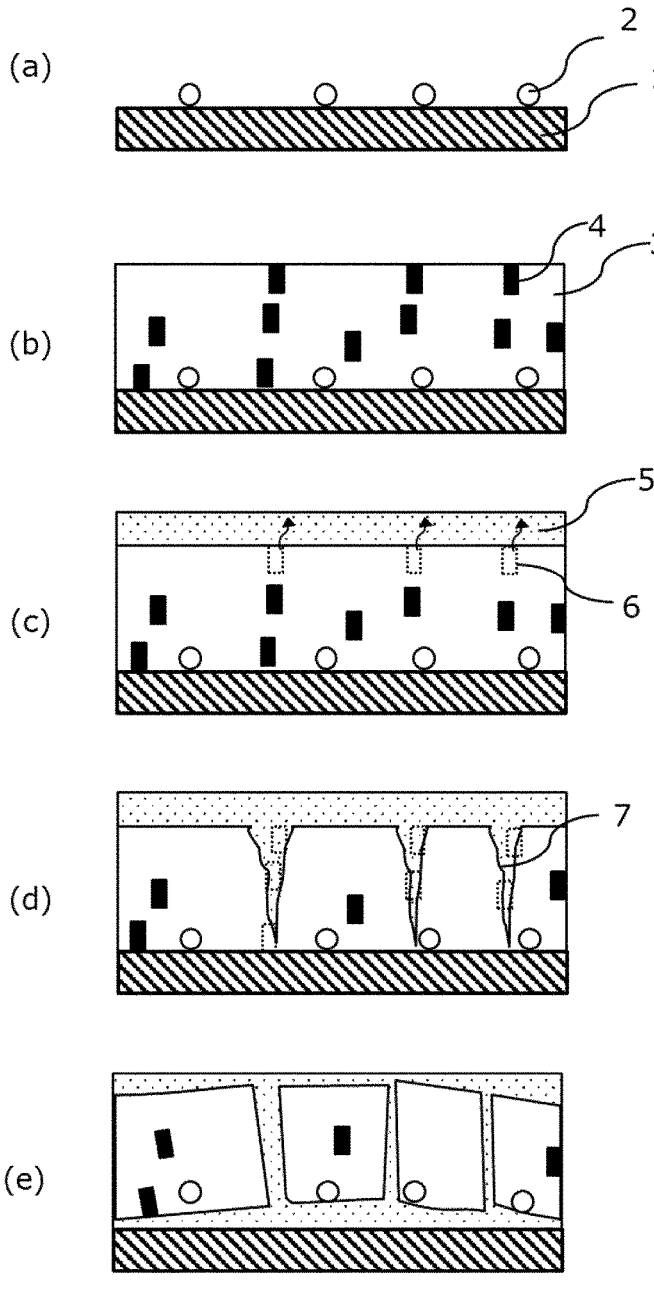

SUBSTRATE CLEANING SOLUTION, AND USING THE SAME, METHOD FOR MANUFACTURING CLEANED SUBSTRATE AND METHOD FOR MANUFACTURING DEVICE

CROSS-REFERENCE TO RELATED APPLICATIONS

This application is a National stage application (under 35 U.S.C. § 371) of PCT/EP2021/064507, filed May 31, 2021, which claims benefit of Japanese Application No. 2020-096652, filed Jun. 3, 2020, both of which are incorporated herein by reference in their entirety.

BACKGROUND OF THE INVENTION

Technical Field

The present invention relates to a substrate cleaning solution for cleaning a substrate and a method for cleaning a substrate using the same.

Background Art

Conventionally, in the process of manufacturing a substrate, debris may be generated, for example, by a lithography process or the like. Therefore, the substrate manufacturing process may include a cleaning step for removing particles on the substrate. In the cleaning step, there are methods such as a method for physically removing particles by supplying a cleaning solution such as deionized water (DIW: Deionized water) on the substrate and a method for chemically removing particles with chemicals. However, as patterns become finer and more complicated, they become more susceptible to physical or chemical damage.

As a substrate cleaning step, a method of forming a film to hold particles in the film and removing the film by a remover has been studied. When the formed film is all dissolved by the remover, the particles held in the film can be reattached. Therefore, a method of partially dissolving the formed film and removing the undissolved portion in a solid state has been studied (for example, Patent Document 1 and 2).

PRIOR ART DOCUMENTS

Patent Documents

[Patent document 1] JP 2019-212889 A
[Patent document 2] JP 2019-212890 A

SUMMARY OF THE INVENTION

Problems to be Solved by the Invention

The present inventors considered that in the technology of forming a film on a substrate to remove particles, there are one or more problems still need improvements. They include, for example, the followings: removal of particles is not effective; films formed cannot be fully removed by a remover and remain; solutes cannot be fully solved and sometimes precipitate.

The present invention has been made based on the technical background as described above and provides a substrate cleaning solution.

Means for Solving the Problems

The substrate cleaning solution according to the present invention comprises an insoluble or hardly soluble solute (A), a soluble solute (B), and a solvent (C):
wherein
the solvent (C) comprises water (C-1); and
the content of the soluble solute (B) is 0.1 to 500 mass % based on water (C-1);
preferably the substrate cleaning solution is dripped on a substrate and dried to remove at least a part of the solvent (C) to form a film, the film being then removed from the substrate by a remover;
preferably the insoluble or hardly soluble solute (A) is insoluble or hardly insoluble by the remover; and/or preferably the soluble solute (B) is soluble by the remover.

Further, the present invention also provides a method for manufacturing a cleaned substrate comprising the following steps:
(1) dripping above-mentioned substrate cleaning solution on a substrate;
(2) removing at least a part of the solvent (C) to form a film;
(3) making the film hold particles on the substrate; and
(4) applying a remover on the substrate to remove the film holding particles.

Further, the present invention provides a device manufacturing method, comprising the method for manufacturing a cleaned substrate of the present invention.

Effects Of The Invention

Using the substrate cleaning solution according to the present invention, it is possible to desire one or more of the following effects.

It is possible to effectively remove particles; it is possible to sufficiently peel off the formed film from the substrate and to remove it; since there is a portion, which becomes a trigger that the film peels, in the film, it is possible to sufficiently remove the film; since there is no need to dissolve most of the film to remove, it is possible to prevent the detachment of the held particles; the film can be effectively removed by cleaning after removing a remover; and solutes have a good dissolution property to the solvent.

BRIEF DESCRIPTION OF THE DRAWINGS

FIG. 1 is a cross section that schematically illustrates the appearance of a substrate surface in the substrate cleaning according to the present invention.

DETAILED DESCRIPTION OF THE INVENTION

Mode for Carrying Out the Invention

The embodiments of the present invention are described below in detail.

Definition

Unless otherwise specified, the definitions and examples described in this paragraph are followed.

The singular form includes the plural form and "one" or "that" means "at least one". An element of a concept can be expressed by a plurality of species, and when the amount (for example, mass % or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has a plural types of repeating units, these repeating units copolymerize. These copolymerization may be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, 20 degrees means 20 degrees Celsius.

The additive refers to a compound itself having a function thereof (for example, in the case of a base generator, the compound itself that generates a base). An aspect in which the compound is dissolved or dispersed in a solvent and added to the composition is also possible. As one embodiment of the present invention, it is preferable that such a solvent is contained in the composition according to the present invention as the solvent (C) or another component.

<Substrate Cleaning Solution>

The substrate cleaning solution according to the present invention comprises an insoluble or hardly soluble solute (A) (hereinafter sometimes referred to as component (A), and the same applies to 2 and thereafter), a soluble solute (B), and a solvent (C), wherein component (C) comprises water (C-1); and the content of the soluble solute (B) is 0.1 to 50 mass % based on water (C). Preferably, the insoluble or hardly soluble solute (A) is insoluble or hardly insoluble by the remover. Further, preferably, the soluble solute (B) is soluble by the remover.

In the present invention, the above "solute" is not limited to the state of being dissolved in the solvent (C), and a suspended state thereof is also accepted. In a preferred embodiment of the present invention, the solutes, components, and additives contained in the substrate cleaning solution are soluble in the solvent (C). The substrate cleaning solution in this embodiment is considered to have good embedding properties or film uniformity.

The substrate cleaning solution according to the present invention is preferably dripped on a substrate and dried to remove at least a part of the solvent (C) to form a film, the film being then removed from the substrate by a remover.

"to form a film" means to from one film and to be in a state of coexistence in one film. One embodiment of "film formation" is "solidified" of the film. Furthermore, it is enough that the film obtained from the substrate cleaning solution has a hardness to the extent to hold particles, and the solvent (C) is not required to be completely removed (for example, through vaporization). The substrate cleaning solution becomes a film while gradually shrinking as the solvent (C) vaporizes. It is accepted that an extremely small amount of the insoluble or hardly soluble solute (A) and the soluble solute (B) is removed (for example, vaporization, volatilization). For example, it is accepted that 0 to 10 mass % (preferably 0 to 5 mass %, more preferably 0 to 3 mass %, further preferably 0 to 1 mass %, and further more preferably 0 to 0.5 mass %) relative to the original amount is removed.

Although this is not intended to limit the scope of the invention and not to be bound by theory, it is considered that particles are removed by being held in the film on the substrate and being peeled off by a remover that is described later. Further, it is considered that the soluble solute (B) generates a portion which becomes a trigger that the film peels. It is considered that when water (C-1) is comprised in the film, the soluble solute (B) can be easily removed from the substrate and efficient removal can be achieved.

<Insoluble or Hardly Soluble Solute (A)>

The substrate cleaning solution according to the present invention comprises an insoluble or hardly soluble solute (A).

The insoluble or hardly soluble solute (A) comprises at least one of novolak derivatives, phenol derivatives, polystyrene derivatives, polyacrylate derivatives, polymaleic acid derivatives, polycarbonate derivatives, polyvinyl alcohol derivatives, polymethacrylate derivatives, and copolymer of any combination of any of these.

Novolak derivatives preferably comprise the following repeating unit:

wherein

X is each independently $C_{1-27}$ substituted or unsubstituted hydrocarbon group. X is preferably methyl or t-butyl, and more preferably methyl.

a1 is 1 to 2, preferably 1.

a2 is 0 to 3, preferably 0 or 1, and more preferably 1.

Exemplified examples of the repeating units of novolak derivatives are following:

Phenol derivatives are particularly limited, but preferably have a molecular weight of 150 or more and are solid at normal temperature (20° C.). More particular embodiments of phenol derivatives include a compound represented by the following formula and polymer thereof.

5

6

Wherein $R_1$ to $R_5$ are each independently hydrogen, C1-6 alkyl (preferably methyl, ethyl, isopropyl or n-propyl), hydroxy, phenyl, benzyl, aldehyde, amino, nitro, or sulfo.

Exemplified examples of phenol derivatives include following structures.

Polystyrene derivatives can be polyhydroxystyrene derivatives; preferably polyhydroxystyrene derivatives. Exemplified examples of polystyrene derivatives include one having a structure represented by the following formulae:

wherein R is hydrogen, $C_{1-6}$ alkyl (preferably methyl, ethyl, isopropyl or n-propyl), phenyl, benzyl, aldehyde, amino, or nitro.

Exemplified examples of polyacrylate derivatives include one having a structure represented by the following formula:

wherein R is $C_{1-6}$ alkyl (preferably methyl, ethyl, isopropyl or n-propyl), phenyl, benzyl, aldehyde, amino, or nitro.

Exemplified examples of polymaleic acid derivatives include one having a structure represented by the following formula:

wherein $R_1$ and $R_2$ are each independently $C_{1-6}$ alkyl (preferably methyl, ethyl, isopropyl or n-propyl), phenyl, benzyl, aldehyde, amino, or nitro.

Exemplified examples of polycarbonate derivative include one represented by the following formula.

Exemplified examples of polyvinyl alcohol derivatives include one represented by the following formula.

Exemplified examples of polymethacrylate derivatives include one represented by the following formula, and preferably polymethylmethacrylate.

Wherein R is $C_{1-6}$ alkyl (preferably methyl, ethyl, isopropyl or n-propyl), phenyl, benzyl, aldehyde, amino, or nitro.

The insoluble or hardly soluble solute (A) comprises preferably at least one of novolak derivatives, phenol derivatives, polyhydroxystyrene derivatives, polyacrylate derivatives, polycarbonate derivatives, polymethacrylate derivatives, and copolymer of any combination of any of these; more preferably at least one of novolak derivatives, phenol derivatives, polyhydroxystyrene derivatives, and copolymer of any combination of any of these; further preferably at least one of novolak derivatives, phenol derivatives, and polyhydroxystyrene derivatives; and further more preferably novolak derivatives.

The substrate cleaning solution according to the present invention may comprise one or more of the above-mentioned preferred examples in combination as the insoluble or hardly soluble solute (A). For example, the insoluble or hardly soluble solute (A) may contain both novolak and polyhydroxystyrene.

Preferably, the insoluble or hardly soluble solute (A) does not contain fluorine and/or silicon, and more preferably, it contains neither of them. Said "the insoluble or hardly soluble solute (A) does not contain fluorine and/or silicon" means that the content of fluorine and silicon is preferably 5 mass % or less, more preferably 1 mass % or less, further preferably 0.1 mass %, and further more preferably 0.00 mass %, based on (A) if (A) is not a polymer; and means that the number of repeating units containing fluorine and silicon is preferably 5% or less, more preferably 1% or less, further preferably 0.1% or less, and further preferably 0.00% or less, based on the number of total repeating units if (A) is a polymer.

The above-mentioned copolymerization is preferably random copolymerization or block copolymerization.

The weight-average molecular weight ($M_w$) of the insoluble or hardly soluble solute (A) is 150 to 500,000, more preferably 300 to 300,000, further preferably 500 to 100,000, and further more preferably 1,000 to 50,000. Here, the mass average molecular weight is a mass average molecular weight in terms of polystyrene, which can be measured by gel permeation chromatography based on polystyrene.

The insoluble or hardly soluble solute (A) can be obtained through synthesis thereof. It is also possible to purchase it. When purchasing, examples of the supplier are indicated below. It is also possible that the supplier synthesizes the insoluble or hardly soluble solute (A) so as to make the effects of the present invention be exhibited.

novolak: Showa Kasei, Asahi Yukizai, Gunei Chemical Industry, Sumitomo Bakelite
polyhydroxystyrene: Nippon Soda, Maruzen Petrochemical, Toho Chemical Industry
polyacrylic acid derivatives: Nippon Shokubai
polycarbonate: Sigma-Aldrich
polymethacrylic acid derivatives: Sigma-Aldrich The content of the insoluble or hardly soluble solute (A) is 0.1 to 50 mass %, preferably 0.5 to 30 mass %, more preferably 1 to 20 mass %, and further preferably 1 to 10 mass %, and further more preferably 2 to 7 mass %, based on the substrate cleaning solution.

The solubility can be evaluated by known methods. For example, it can be determined under the condition of 20 to 35° C. (more preferably 25±2° C.) by providing a flask charged with 100 ppm of component (A) or component (B) in 5.0 mass % ammonia water, covering the flask with a cap, shaking for 3 hours in a shaker, and confirming whether component (A) or component (B) is dissolved or not. The shaking may be stirring. Dissolution can be also judged visually. If it is not dissolved, the solubility is determined to be less than 100 ppm, and if it is dissolved, the solubility is determined to be 100 ppm or more. In the present specification, the solubility of less than 100 ppm is determined to be insoluble or hardly soluble, and the solubility of 100 ppm or more is determined to be soluble. In the present specification, soluble includes slightly soluble in a broad sense. In the present specification, the solubility becomes higher in the order of insoluble, hardly soluble and soluble. In the present specification, slightly soluble is less soluble than soluble and more soluble than hardly soluble in a narrow sense.

Preferably, the solubility of the insoluble or hardly soluble solute (A) in 5.0 mass % ammonia water is less than 100 ppm, and the solubility of the soluble solute (B) in 5.0 mass % ammonia water is 100 ppm or more.

Above-mentioned 5.0 mass % ammonia water may be changed to a remover (described later) that is used in a later process. The liquid to be used in the solubility evaluation and the remover do not have to be identical, and the coexistence of components having different solubilities is considered to be one point for exhibiting the effects of the present invention. A preferred embodiment of the present invention is an embodiment in which the component (B) present in the film formed from the substrate cleaning solution is dissolved by the remover to give a trigger that the film peels. Therefore, if a portion of the component (B) can be dissolved by the remover, it is considered that the effects of the present invention can be expected. Therefore, for example, even if the remover is weaker in alkalinity than the liquid used in the solubility evaluation, it is considered that the effects of the present invention are exhibited.

<Soluble Solute (B)>

The substrate cleaning solution according to the present invention comprises a soluble solute (B). The soluble solute (B) is preferably a compound comprising carboxyl, sulfo, or phospho, more preferably a compound comprising carboxyl or phospho, and further preferably a compound comprising carboxyl.

The acid dissociation constant pKa ($H_2O$) of the soluble solute (B) is preferably −5 to 11, more preferably −1 to 8, further preferably 1 to 7, and further more preferably 2 to 6.

The soluble solute (B) is preferably a crack accelerating component (B'), where the crack accelerating component (B') preferably comprises hydrocarbon comprising carboxyl.

Although this is not intended to limit the scope of the invention and not to be bound by theory, it is considered that the substrate cleaning solution is dried to form a film on the substrate, and when the remover peels off the film, the soluble solute (B) generates a portion to become a trigger that the film peels. For this purpose, it is preferable that the soluble solute (B) has a higher solubility in the remover than the insoluble or hardly soluble solute (A).

Preferably, the soluble solute (B) comprises a structural unit represented by the formula (B-1):

(B-1)

wherein $L_1$ is a linker selected from at least one of a single bond, $C_{1-4}$ alkylene, phenylene, ether, carbonyl, amide, and imide, preferably a linker selected from at least one of a single bond, methylene, ethylene, phenylene, and amide, more preferably a linker selected from a single bond and phenylene, and further more preferably a single bond. When $L_1$ is a linker selected from amide and imide, H present in a portion other than the linking portion between $R_1$ and mainchain may or may not be substituted with methyl, and preferably not be substituted.

$R_1$ is carboxyl, sulfo, or phospho, preferably carboxyl or sulfo, and more preferably carboxyl.

$R_2$ is hydrogen, methyl, or carboxyl, preferably hydrogen or carboxyl, and more preferably hydrogen.

$R_3$ is hydrogen or methyl, and preferably hydrogen.

Preferably, the soluble solute (B) is a polymer comprising a structural unit represented by the formula (B-1). Preferred examples of the polymer comprising a structural unit represented by the formula (B-1) include polyacrylic acid, polymaleic acid, polystyrenesulfonic acid, or a polymer of any combination of any of these. Polyacrylic acid and copolymer of maleic acid and acrylic acid are further preferred examples.

In the case of copolymerization, it is preferably random copolymerization or block copolymerization, and more preferably random copolymerization.

Copolymer of maleic acid and acrylic acid is given as an example for explanation. The copolymer is contained in (B-1) and has two types of structural units represented by (B-1).

The molecular weight of the soluble solute (B) (if it is a polymer, mass-average molecular weight ($M_w$) is preferably 500 to 500,000, more preferably 1,000 to 100,000, more preferably 2,000 to 50,000, further preferably 5,000 to 50,000, and further more preferably 5,000 to 40,000.

The soluble solute (B) can be obtained even by either synthesizing or purchasing. As a supplier, Sigma-Aldrich, Tokyo Chemical Industry Co., Ltd. and Nippon Shokubai Co., Ltd. are mentioned.

The content of the soluble solute (B) is preferably 1 to 100 mass %, more preferably 1 to 50 mass %, further preferably 1 to 30 mass %, and further more preferably 1 to 10 mass %, based on the total mass of the insoluble or hardly soluble solute (A).

<Solvent (C)>

The substrate cleaning solution according to the present invention comprises a solvent (C). The solvent (C) comprises water (C-1). The content of the soluble solute (B) is 0.1 to 500 mass Ws, preferably 0.1 to 100 mass Ws, more preferably 0.5 to 50 mass %, further preferably 0.5 to 10 mass Ws, based on water (C-1). Water (C-1) is preferably deionized water (DIW).

Water (C-1) comprised in the substrate cleaning solution can be partially removed during film formation but is at least partially present in the film after film formation. Without wishing to be bound by theory, it is thought that the presence of water (C-1) in the film promotes penetration of the remover, thereby enabling more efficient removal of the film. When the component (B) has an acidic group, for example, carboxyl, it is thought that the component (B) in the film forms a film state in a state of interacting with water (C-1) and can serve as a starting point for promoting the penetration of the remover. Thus, it is considered that the film residue can be reduced.

The content of water (C-1) is preferably 0.01 to 50 mass %, more preferably 0.01 to 20 mass %, and further preferably 0.05 to 20 mass %, based on the solvent (C).

Preferably, the solvent (C) comprises an organic solvent (C-2).

Preferably, the organic solvent (C-2) has volatility. In the present invention, having volatility means to have higher volatility compared with water. For example, the boiling point of the organic solvent (C-2) at one atmospheric pressure is preferably 50 to 250° C., more preferably 50 to 200° C., further preferably 60 to 170° C., and further more preferably 70 to 150° C.

The organic solvent (C-2) includes alcohols such as isopropanol (IPA); ethylene glycol monoalkyl ethers such as ethylene glycol monomethyl ether and ethylene glycol monoethyl ether; ethylene glycol mono alkyl ether acetates such as ethylene glycol monomethyl ether acetate and ethylene glycol monoethyl ether acetate; propylene glycol monoalkyl ethers such as propylene glycol monomethyl ether (PGME), propylene glycol monoethyl ether (PGEE); propylene glycol monoalkyl ether acetates such as propylene glycol monomethyl ether acetate (PGMEA) and propylene glycol monoethyl ether acetate; lactic acid esters such as methyl lactate and ethyl lactate (EL); aromatic hydrocarbons such as toluene and xylene; ketones such as methyl ethyl ketone, 2-heptanone and cyclohexanone; amides such as N,N-dimethylacetamide and N-methyl pyrrolidone; and lactones such as γ-butyrolactone. These organic solvents can be used alone or in any combination of any two or more of these.

In a preferred embodiment, the organic solvent (C-2) is selected from IPA, PGME, PGEE, EL, PGMEA, and any combination of any of these. When the organic solvent is a combination of two, the volume ratio is preferably 20:80 to 80:20, and more preferably 30:70 to 70:30.

The solubility of the organic solvent (C-2) in water is preferably 10 g/100 g $H_2O$ or more, more preferably 20 g/100 g $H_2O$ or more, further preferably 25 to 1,000 g/100 g $H_2O$ and further more preferably 50 to 200 g/100 g $H_2O$. The measurement of the solubility in water is preferably carried out at normal temperature and normal pressure, where normal temperature is 20 to 30° C., preferably 22 to 28° C. and normal pressure is preferably standard atmospheric pressure or ±15% range around standard atmospheric pressure.

As a preferred embodiment of the present invention, it is considered that by using one kind of organic solvent (C-2) having high solubility in water, even if the other kind of organic solvent has low solubility in water, as a result, any organic solvent can be dissolved in water.

In one embodiment of the present invention, the content of the solvent (C) is 0.1 to 99.9 mass %, preferably 50 to 99.9 mass %, more preferably 75 to 99.5 mass %, further preferably 80 to 99 mass %, and further more preferably 90 to 99 mass %, based on the substrate cleaning solution.

<Further Additive (D)>

The substrate cleaning solution of the present invention may additionally comprise a further additive (D) other than components (A) to (C). The further additive (D) comprises a surfactant, an acid, a base, an antibacterial agent, a germicide, an antiseptic or an antifungal agent, and it may comprise any combination of any of these. The further additive (D) preferably comprises a surfactant.

In one embodiment of the present invention, the content of the further additive (D) (in the case of plural, the sum thereof) is 0 to 100 mass %, preferably 0 to 10 mass %, more preferably 0 to 5 mass %, further preferably 0 to 3 mass %, and further more preferably 0 to 1 mass %, based on the insoluble or hardly soluble solute (A). Containing no further additive (0 mass %) is also a preferred embodiment of the present invention.

<Remover>

As described above, the substrate cleaning solution of the present invention is dripped on a substrate and dried to remove at least a part of the solvent (C) to form a film. Then, the film is removed from the substrate by a remover. The film is capable of holding particles present on the substrate, and it is a preferred embodiment of the present invention that the film is removed by the remover while holding.

The remover can be alkaline, neutral or acidic, but is preferably neutral. In one embodiment of the present invention, pH of the remover is 6 to 8, preferably 6.5 to 7.5, more preferably 6.8 to 7.2, and further preferably 6.9 to 7.1. Exemplified example of the neutral remover is DIW.

In other embodiment of the present invention, the remover can be alkaline. pH of the alkaline remover is 7 to 13, preferably 8 to 13, and more preferably11 to 12.5.

The measurement of pH is preferably carried out after being degassed, to avoid the influence of the dissolution of carbon dioxide gas in the air.

Although this is not intended to limit the scope of the invention and not to be bound by theory, a state of cleaning the substrate according to the present invention is described using a schematic figure for the understanding of the present invention.

The substrate cleaning solution used in the embodiment of FIG. 1 comprises an insoluble or hardly soluble solute (A), a soluble solute (B) and a solvent (C). (a) shows a state in which particles 2 are attached to the substrate 1. The substrate cleaning solution of the present invention is dripped on this substrate and dried to remove at least a part of the solvent (C) and the state in which the component (A) and component (B) form a film is shown by (b). In (b), the film becomes a particle holding layer 3. The component (B) is present in the particle holding layer 3. Thereafter, the remover 5 is applied on the film, and the state in which the component (B) has dissolved in the remover 5 is shown by (c). Through such a dissolution, traces 6 due to the elution of the component (B) in the particle holding layer 3 are generated. The state in which the cracks 7 grow from the traces 6 is shown by (d). The state in which the film parted by the growth of the cracks 7 is removed from the substrate while holding particles is shown by (e). The state of the substrate obtained by being cleaned is shown by (f).

<Cleaning of substrate>

The substrate cleaning solution of the present invention can be used to clean a substrate. For the cleaning of a substrate, a known method or an apparatus (for example, described in JP 2018-110220 A) can be used. The present invention provides a method for manufacturing a cleaned substrate as one embodiment.

The method for cleaning a substrate is described below using a more particular embodiment. In the following, numbers in parentheses indicate the order of steps. For example, when the steps (0-1), (0-2) and (1) are described, the order of the steps is as described above.

The method for manufacturing a cleaned substrate of the present invention comprises the following steps :

(1) dripping the substrate cleaning solution according to the present invention on a substrate;
(2) removing at least a part of the solvent (C) to form a film;
(3) making the film hold particles on the substrate; and
(4) applying a remover on the substrate to remove the film holding particles.

Above (1) is carried out by dripping the substrate cleaning solution nearly at the center of the horizontally postured substrate through a nozzle or the like in an apparatus suitable for substrate cleaning. The dripping may be in the form of liquid column or dropping. At the time of the dripping, the substrate is rotated, for example, at 10 to several tens of rpm, so that the generation of dripping traces can be suppressed.

The dripping amount is preferably 0.5 to 10 cc. These conditions can be adjusted so that the substrate cleaning solution is uniformly applied and spread.

The removal of the solvent (C) described in above (2) is carried out by drying, preferably by spin-drying. The spin-dry is carried out at preferably 500 to 3,000 rpm, more preferably 500 to 1,500 rpm, and further preferably 500 to 1,000 rpm, for preferably 0.5 to 90 seconds, more preferably 5 to 80 seconds, further preferably 15 to 70 seconds, and further more preferably 30 to 60 seconds. Accordingly, the solvent (C) can be dried while spreading the substrate cleaning solution over the entire surface of the substrate. Preferably, the substrate is a disk shape substrate having a diameter of 200 to 600 mm, more preferably 200 to 400 mm.

Making the film hold particles on the substrate referred in above (3) means it is carried out by removing the solvent (C) referred in above (2), whereby the insoluble or hardly soluble solute (A) forms a film and holds particles. That is, it can be said also that the above steps (2) and (3) occur continuously by one operation. Here, the removal of the solvent (C) referred in above (2) accepts a state in which the solvent (C) slightly remains in the film. In one embodiment of the present invention, 95% or more, preferably 98% or more, and more preferably 99% or more, of the solvent (C) is volatilized at the end of above steps (2) and (3) and does not remain in the film.

Above steps (2) and/or (3) may be carried out while raising the temperature in the apparatus. It can be expected that raising of the temperature promotes the volatilization of the solvent (C) and the film formation of solid components such as the insoluble or hardly soluble solute (A). When the temperature is raised, it is preferably 40 to 150° C.

In above (4), a remover is applied on the substrate to remove the film in which particles are held (particle holding layer). The application can be performed by dripping, spraying, or dipping. The dripping may be performed so as to form a liquid pool (paddle) on the substrate or may be dripped continuously. In one embodiment of the present invention, the remover is dripped at the center of the substrate while the substrate is rotating at 500 to 800 rpm.

When the remover removes (for example, peels off) the particle holding layer, it is considered that the soluble solute (B) remained in the film generates a portion to become a trigger that the film peels. Accordingly, it is preferable that the soluble solute (B) has a higher solubility in the remover than the insoluble or hardly soluble solute (A).

It is a preferable embodiment of the present invention that the particle holding layer is removed from the substrate while holding particles without being completely dissolved by the remover. The particle holding layer is considered to be removed by, for example, becoming in a state of being finely cut by the "portion to become a trigger that the film peels".

In the method for cleaning a substrate according to the present invention, an embodiment additionally including at least one steps other than the above is also preferable. Such processes include those known in the substrate cleaning. For example, the following steps may be mentioned.

(0-1) A step of processing the substrate by etching to form a pattern and removing an etching mask The substrate to be cleaned may be a processed substrate, and the processing may be performed by a lithography technique.

(0-2) A Step of Cleaning the Substrate

In order to reduce the number of particles on the substrate, the substrate may be cleaned with a known cleaning solution (such as a rinse solution). It is one of the objects of the present invention to remove a few particles that remain even by this.

(0-3) A Step of Prewetting the Substrate

It is also a preferred embodiment to prewet the substrate in order to improve the coatability of the substrate cleaning solution of the present invention and spread it uniformly on the substrate. Preferably, the liquid used for prewetting (prewetting solution) includes IPA, PGME, PGMEA, PGEE, n-butanol (nBA), pure water, and any combination of any of these.

(0-4) A Step of Cleaning the Substrate

In order to replace the prewetting solution referred in the step (0-3), a step of cleaning the substrate is also a preferred embodiment. It is an embodiment of the present invention to make the step (0-4) unneeded by inserting the step (0-2).

(3-1) A Step of Applying a Liquid on the Particle Holding Layer

It is also possible to include a step of applying a liquid different from the remover after the step (3) in order to enhance the hydrophilicity or hydrophobicity (preferably hydrophilicity) of the particle holding layer. It is preferable that the liquid has a weaker power to dissolve the solid component of the particle holding layer than the remover. The process (3-1) may be omitted. (5) A step of dripping pure water or an organic solvent on the substrate after the removal of the film in which particles are held and removing water or the organic solvent to clean the substrate further It is also a preferred embodiment to further clean the substrate with water or an organic solvent (preferably an organic solvent) in order to remove local film residue and particles residue. The organic solvent includes IPA, PGME, PGMEA, PGEE, nBA, and any combination of at least two of these. Exemplified embodiment includes cleaning using IPA in (5).

Although this is not intended to limit the scope of the invention and not to be bound by theory, it is considered that when local film residue is removed in (5), in the case where the component B has an acidic group (for example, carboxyl), the component (B) in the film forms the local film residue in a state of interacting with water (C-1), whereby the affinity with the organic solvent increases and the removal of the film residue becomes more efficient.

(6) A step of drying the substrate

The means for drying the substrate include spin drying, supplying dry gas (such as spraying), reduced pressure, heating, and any combination of any of these.

<Substrate>

The substrate to be cleaned in the present invention include semiconductor wafers, glass substrates for liquid crystal display, glass substrates for organic EL display, glass substrates for plasma display, substrates for optical disk, substrates for magnetic disk, substrates for magneto-optical disk, glass substrates for photomask, substrates for solar cell, and the like. The substrate may be a non-processed substrate (for example, a bare wafer) or a processed substrate (for example, a patterned substrate). The substrate may be composed by laminating a plurality of layers. Preferably, the surface of the substrate is a semiconductor. The semiconductor may be composed of oxide, nitride, metal, and any combination of any of these. Further, the surface of the substrate is preferably selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TiN, SiCN, NbN, Cu, Ta, W, Hf, Ru, Co amorphous carbon, and Al.

s<Device>

By further processing the substrate manufactured by the cleaning method according to the present invention, a device can be manufactured. Examples of the device include semiconductors, liquid crystal display devices, organic EL display devices, plasma display devices, and solar cell devices. A known method can be used for processing these. After device formation, if desired, the substrate can be cut into chips, connected to lead frame, and packaged with resin. One example of this packaged product is a semiconductor.

The present invention is described below with reference to examples. In addition, the embodiment of the present invention is not limited only to these examples.

<Comparative Preparation Example 1 of Comparative Cleaning Solution 1>

Isopropanol (IPA) is used as the solvent (C-2). Novolak (Mw: about 5,000) as the insoluble or hardly soluble solute (A) and polyacrylic acid (Mw: about 15,000) as the soluble solute (B) are used. (A) and (B) are added to the solvent (C-2) so that the solid component (sum of (A) and (B)) in the cleaning solution is 5.0 mass %. The mass ratios of (A) and (B) are as shown in Table 1. In particular, above addition is carried out at a ratio of 5 mass % of polyacrylic acid to 100 mass % of novolak in comparative cleaning solution 1. The resultant is stirred with a stirrer for 1 hour to obtain a solution having a solid component concentration of 5 mass %. This solution is filtered with Optimizer UPE (Nihon Entegris, UPE, pore diameter: 10 nm). Thereby, comparative cleaning solution 1 is obtained.

15

Novolak (Mw about 5,000)

COOH

Polyacrylic acid (Mw about 15,000)

TABLE 1

| Insoluble or hardly soluble solute (A) | (A) Solubility | Soluble solute (B) | (B) Solubility | Solvent (C-1) | Solvent (C-2) | Removal evaluation | Residual film amount |
|---|---|---|---|---|---|---|---|
| Comparative cleaning solution 1 | novolak, Mw = 5,000 | X | polyacrylic acid, MW = 15,000 | Z | DIW | IPA | AA | B |
| | 100% | | 5% | | 0 | 100 | | |
| Comparative cleaning solution 2 | novolak, Mw = 5,000 | X | polyacrylic acid, Mw = 15,000 | Z | DIW | IPA | AA | B |
| | 100% | | 1% | | 0 | 100 | | |
| Comparative cleaning solution 3 | novolak, Mw = 5,000 | X | polyacrylic acid, Mw = 15,000 | Z | DIW | IPA | AA | B |
| | 100% | | 10% | | 0 | 100 | | |
| Comparative cleaning solution 4 | novolak, Mw = 5,000 | X | polyacrylic acid, Mw = 15,000 | Z | DIW | PGME | AA | B |
| | 100% | | 5% | | 0 | 100 | | |
| Comparative cleaning solution 5 | novolak, Mw = 5,000 | X | polyacrylic acid, MW = 15,000 | Z | DIW | PGEE | AA | B |
| | 100% | | 5% | | 0 | 100 | | |
| Comparative cleaning solution 6 | novolak, Mw = 5,000 | X | polyacrylic acid, MW = 15,000 | Z | DIW | EL | AA | B |
| | 100% | | 5% | | 0 | 100 | | |
| Comparative cleaning solution 7 | novolak, Mw = 5,000 | X | polymaleic acid, Mw = 15,000 | Z | DIW | IPA | AA | B |
| | 100% | | 5% | | 0 | 100 | | |
| Comparative cleaning solution 8 | novolak, Mw = 5,000 | X | poly(acrylic acid-co-maleic acid), MW = 15,000 | Z | DIW | IPA | AA | B |
| | 100% | | 5% | | 0 | 100 | | |

In Table 1, the lower parts of the solutes indicate the mass ratio of (A) and (B).

<Comparative Preparation Examples 2 to 8 of Comparative Cleaning Solutions 2 to 8>

Comparative Cleaning Solutions 2 to 8 are obtained by carrying out the preparation in the same manner as in Comparative Preparation Example 1 except that the solutes, the solvent, and the ratio are changed to those shown in Table 1.

<Evaluation of Solubility>

4 mg of each component (for example, novolak (Mw: about 5,000)) is put in a 50 mL sample bottle, and 5.0 mass % ammonia water is added to make the total amount to 40 g. Covering this with a cap, it is shaken and stirred for 3 hours. This gives a liquid having a component concentration of 100 ppm.

The same procedure as described above is carried out except that the amount of each component added is changed to 40 mg, and a liquid having a component concentration of 1,000 ppm is obtained. Their solubility is checked visually. Evaluation criteria are as shown below.

X: When the dissolution residue is confirmed at 100 ppm and 1,000 ppm, it is judged to be insoluble or hardly soluble.

Y: When the dissolution residue is not confirmed at 100 ppm but confirmed at 1,000 ppm, it is judged to be slightly soluble.

Z: When the dissolution residue is confirmed at neither 100 ppm nor 1,000 ppm, it is judged to be soluble.

The evaluation results are shown in Table 1.

<Preparation of Evaluation Substrates for Removal Evaluation>

Particles are attached to a 12-inch bare Si substrate. Ultra-high purity colloidal silica (PL-10H, Fuso Chemical Industry Co., Ltd., average primary particle size: 90 nm) is used as particles for experiment. 50 mL of the silica fine particle composition is dripped and applied by rotating at 500 rpm for 5 seconds. Thereafter, the solvent of the silica fine particle composition is spin-dried by rotating at 1000 rpm for 30 seconds. Thereby, an evaluation substrate is obtained.

<Removal Evaluation>

Evaluation substrates prepared as described above are used.

Using Coater/Developer RF[3] (SOKUDO Co., Ltd.), 10 cc of each cleaning solution is dripped on each evaluation substrate, and coating and drying are performed by rotating at 1,500 rpm for 60 seconds. While rotating the substrate at 100 rpm, 5.0 mass % ammonia water is dripped for 10 seconds, the whole substrate is covered with 5.0 mass % ammonia water, and this state is maintained for 20 seconds. By rotating the substrate at 1,500 rpm, the film is peeled off and removed to dry the substrate.

The amounts of residual particles on these substrates are compared using a dark field defect inspection system (LS-9110, Hitachi High-Technologies Corporation).

The state of coating and the state of film removal are confirmed, the number of residual particles is counted and evaluated according to the following criteria. The evaluation results are shown in Table 1.

AA: ≤10 pieces
A: >10 pieces, ≤100 pieces
B: >100 pieces, ≤1,000 pieces
C: >1,000 pieces
D: film is not uniformly coated, or film is not removed <Evaluation of Residual Film Amount>

Using Coater/Developer RF[3] (SOKUDO Co., Ltd.), 10 cc of each cleaning solution is dripped on each 12-inch bare Si substrate, and coating and drying are performed by rotating at 1,500 rpm for 60 seconds. While rotating the substrate at 100 rpm, isopropanol is dripped for 10 seconds, the whole substrate is covered with isopropanol. The rotation of the substrate is stopped, and this state is maintained for 60 seconds. Then, by rotating the substrate at 1,500 rpm, the cleaning solution is spun off, and the substrate is dried. The film formed by applying and drying the cleaning solution sometimes cannot be removed by isopropanol, and the amount of the remaining film is evaluated as the residual film amount.

These residual film amount on the substrate is measured using ellipsometer M-2000 (J. A. Woollam Japan). The evaluation criteria are following.

AA: Residual film is not detected.

A: Residual film of 0.05 to 0.1 nm is detected.

B: Residual film thicker than 0.1 nm is detected.

C: A situation where film coating fails, or film is not removed is confirmed.

<Preparation Example 1 of Example Cleaning Solution 1>

DIW as the solvent (C-1) and Isopropanol (IPA) as the solvent (C-2) are mixed in a volume ratio of 10:90. This is used as the solvent (C).

Novolak (Mw: about 5,000) as the insoluble or hardly soluble solute (A) and polyacrylic acid (Mw: about 15,000) as the soluble solute (B) are used. (A) and (B) are added to the solvent (C) so that the solid component (sum of (A) and (B)) in the cleaning solution is 5.0 mass %. The mass ratios of (A) and (B) are as shown in Table 2-1. The resultant is stirred with a stirrer for 1 hour to obtain a solution having a solid component concentration of 5 mass %. This solution is filtered with Optimizer UPE (Nihon Entegris, UPE, pore diameter: 10 nm). Thereby, Example Cleaning Solution 1 is obtained.

<Preparation Examples 2 to 39 of Example Cleaning Solutions 2 to 39>

Example Cleaning Solutions 2 to 39 are obtained by carrying out the preparation in the same manner as in Preparation Example 1 except that the solutes, the solvent, and the ratio are changed to those shown in Tables 2-1 and 2-2.

TABLE 2-1

| | Insoluble or hardly soluble solute (A) | (A) Solubility | Soluble solute (B) polyacrylic | (B) Solubility | Solvent (C-1) | Solvent (C-2) | Removal evaluation | Residual film amount |
|---|---|---|---|---|---|---|---|---|
| Example cleaning solution 1 | novolak, Mw = 5,000 100% | X | acid, Mw = 15,000 5% | Z | DIW 10 | IPA 90 | AA | AA |
| Example cleaning solution 2 | novolak, Mw = 5,000 100% | X | polyacrylic acid, Mw = 15,000 5% | Z | DIW 5 | IPA 95 | AA | AA |
| Example cleaning solution 3 | novolak, Mw = 5,000 100% | X | polyacrylic acid, Mw = 15,000 5% | Z | DIW 1 | IPA 99 | AA | A |
| Example cleaning solution 4 | novolak, Mw = 5,000 100% | X | polyacrylic acid, Mw = 15,000 5% | Z | DIW 0.1 | IPA 99.9 | | |

TABLE 2-1-continued

| | Insoluble or hardly soluble solute (A) | (A) Solubility | Soluble solute (B) polyacrylic | (B) Solubility | Solvent (C-1) | Solvent (C-2) | Removal evaluation | Residual film amount |
|---|---|---|---|---|---|---|---|---|
| Example cleaning solution 5 | novolak, Mw = 5,000 100% | X | polyacrylic acid, Mw = 15,000 1% | Z | DIW 10 | IPA 90 | AA | AA |
| Example cleaning solution 6 | novolak, Mw = 5,000 100% | X | polyacrylic acid, Mw = 15,000 1% | Z | DIW 5 | IPA 95 | AA | AA |
| Example cleaning solution 7 | novolak, Mw = 5,000 100% | X | polyacrylic acid, Mw = 15,000 1% | Z | DIW 1 | IPA 99 | AA | AA |
| Example cleaning solution 8 | novolak, Mw = 5,000 100% | X | polyacrylic acid, Mw = 15,000 1% | Z | DIW 0.1 | IPA 99.9 | AA | AA |
| Example cleaning solution 9 | novolak, Mw = 5,000 100% | X | polyacrylic acid, Mw = 15,000 10% | Z | DIW 10 | IPA 90 | AA | AA |
| Example cleaning solution 10 | novolak, Mw = 5,000 100% | X | polyacrylic acid, Mw = 15,000 10% | Z | DIW 5 | IPA 95 | AA | AA |
| Example cleaning solution 11 | novolak, Mw = 5,000 100% | X | polyacrylic acid, Mw = 15,000 10% | Z | DIW 1 | IPA 99 | AA | AA |
| Example cleaning solution 12 | novolak, Mw = 5,000 100% | X | polyacrylic acid, Mw = 15,000 10% | Z | DIW 0.1 | IPA 99.9 | AA | A |
| Example cleaning solution 13 | novolak, Mw = 5,000 100% | X | polyacrylic acid, Mw = 15,000 5% | Z | DIW 10 | PGME 90 | AA | AA |
| Example cleaning solution 14 | novolak, Mw = 5,000 100% | X | polyacrylic acid, Mw = 15,000 5% | Z | DIW 5 | PGME 95 | AA | AA |
| Example cleaning solution 15 | novolak, Mw = 5,000 100% | X | polyacrylic acid, Mw = 15,000 5% | Z | DIW 1 | PGME 99 | AA | AA |

TABLE 2-1-continued

| Insoluble or hardly soluble solute (A) | (A) Solubility | Soluble solute (B) polyacrylic | (B) Solubility | Solvent (C-1) | Solvent (C-2) | Removal evaluation | Residual film amount |
|---|---|---|---|---|---|---|---|
| Example cleaning solution 16 | novolak, Mw = 5,000 | X | polyacrylic acid, Mw = 15,000 | Z | DIW | PGME | AA | A |
| | 100% | | 5% | | 0.1 | 99.9 | | |
| Example cleaning solution 17 | novolak, Mw = 5,000 | X | polyacrylic acid, Mw = 15,000 | Z | DIW | PGEE | AA | AA |
| | 100% | | 5% | | 10 | 90 | | |
| Example cleaning solution 18 | novolak, Mw = 5,000 | X | polyacrylic acid, Mw = 15,000 | Z | DIW | PGEE | AA | AA |
| | 100% | | 5% | | 5 | 95 | | |
| Example cleaning solution 19 | novolak, Mw = 5,000 | X | polyacrylic acid, Mw = 15,000 | Z | DIW | PGEE | AA | AA |
| | 100% | | 5% | | 1 | 99 | | |
| Example cleaning solution 20 | novolak, Mw = 5,000 | X | polyacrylic acid, Mw = 15,000 | Z | DIW | PGEE | AA | A |
| | 100% | | 5% | | 0.1 | 99.9 | | |
| Example cleaning solution 21 | novolak, Mw = 5,000 | X | polyacrylic acid, Mw = 15,000 | Z | DIW | EL | AA | AA |
| | 100% | | 5% | | 10 | 90 | | |
| Example cleaning solution 22 | novolak, Mw = 5,000 | X | polyacrylic acid, Mw = 15,000 | Z | DIW | EL | AA | AA |
| | 100% | | 5% | | 5 | 95 | | |
| Example cleaning solution 23 | novolak, Mw = 5,000 | X | polyacrylic acid, Mw = 15,000 | Z | DIW | EL | AA | AA |
| | 100% | | 5% | | 1 | 99 | | |
| Example cleaning solution 24 | novolak, Mw = 5,000 | X | polyacrylic acid, Mw = 15,000 | Z | DIW | EL | AA | A |
| | 100% | | 5% | | 0.1 | 99.9 | | |
| Example cleaning solution 25 | novolak, Mw = 5,000 | X | polymaleic acid, Mw = 15,000 | Z | DIW | IPA | AA | AA |
| | 100% | | 5% | | 10 | 90 | | |

TABLE 2-2

| Insoluble or hardly soluble solute (A) | (A) Solubility | Soluble solute (B) | (B) Solubility | Solvent (C-1) | Solvent (C-2) | Removal evaluation | Residual film amount |
|---|---|---|---|---|---|---|---|
| Example cleaning solution 26 | novolak, Mw = 5,000 | X | polymaleic acid, Mw = 15,000 | Z | DIW | IPA | AA | AA |
| | 100% | | 5% | | 5 | 95 | | |
| Example cleaning solution 27 | novolak, Mw = 5,000 | X | polymaleic acid, Mw = 15,000 | Z | DIW | IPA | AA | AA |
| | 100% | | 5% | | 1 | 99 | | |
| Example cleaning solution 28 | novolak, Mw = 5,000 | X | polymaleic acid, Mw = 15,000 | Z | DIW | IPA | AA | A |
| | 100% | | 5% | | 0.1 | 99.9 | | |
| Example cleaning solution 29 | novolak, Mw = 5,000 | X | poly(acrylic acid-co-maleic acid), Mw = 15,000 | Z | DIW | IPA | AA | AA |
| | 100% | | 5% | | 10 | 90 | | |
| Example cleaning solution 30 | novolak, Mw = 5,000 | X | poly(acrylic acid-co-maleic acid), Mw = 15,000 | Z | DIW | IPA | AA | AA |
| | 100% | | 5% | | 5 | 95 | | |
| Example cleaning solution 31 | novolak, Mw = 5,000 | X | poly(acrylic acid-co-maleic acid), Mw = 15,000 | Z | DIW | IPA | AA | AA |
| | 100% | | 5% | | 1 | 99 | | |
| Example cleaning solution 32 | novolak, Mw = 5,000 | X | poly(acrylic acid-co-maleic acid), Mw = 15,000 | Z | DIW | IPA | AA | A |
| | 100% | | 5% | | 0.1 | 99.9 | | |
| Example cleaning solution 33 | polyhydroxystyrene, Mw = 10,000 | X | polyacrylic acid, Mw = 15,000 | Z | DIW | IPA | AA | AA |
| | 100% | | 5% | | 5 | 95 | | |
| Example cleaning solution 34 | polystyrene, Mw = 5,000 | X | polyacrylic acid, Mw = 15,000 | Z | DIW | IPA | A | AA |
| | 100% | | 5% | | 5 | 95 | | |
| Example cleaning solution 35 | poly(butyl acrylate), Mw = 15,000 | X | polyacrylic acid, Mw = 15,000 | Z | DIW | IPA | A | AA |
| | 100% | | 5% | | 5 | 95 | | |

TABLE 2-2-continued

| Insoluble or hardly soluble solute (A) | (A) Solubility | Soluble solute (B) | (B) Solubility | Solvent (C-1) | Solvent (C-2) | Removal evaluation | Residual film amount |
|---|---|---|---|---|---|---|---|
| Example cleaning solution 36 | poly-carbonate, Mw = 5,000 | X | poly-acrylic acid, Mw = 15,000 | Z | DIW | IPA | A | AA |
| | 100% | | 5% | | 5 | 95 | | |
| Example cleaning solution 37 | polyvinyl alcohol, Mw = 5,000 | X | poly-acrylic acid, Mw = 15,000 | Z | DIW | IPA | A | AA |
| | 100% | | 5% | | 5 | 95 | | |
| Example cleaning solution 38 | poly-methyl-meth-acrylate, Mw = 5,000 | X | poly-acrylic acid, Mw = 15,000 | Z | DIW | IPA | A | AA |
| | 100% | | 5% | | 5 | 95 | | |
| Example cleaning solution 39 | 4,4'-di-hydroxy-tetra-phenyl-methane | X | poly-acrylic acid, Mw = 15,000 | Z | DIW | IPA | AA | AA |
| | 100% | | 5% | | 5 | 95 | | |

In above tables, the lower parts of the solutes indicate the mass ratio of (A) and (B). In above tables, the lower parts of the solvents indicate the volume ratio of (A) and (B).

<Evaluation of Example Cleaning Solutions 1 to 39>

Solubility, removal evaluation, and residual film amount are evaluated in the same manner as described above. The evaluation results are shown in Tables 2-1 and 2-2. In Example Cleaning Solutions, it is confirmed that both removal evaluation and residual film amount are suitable evaluations.

EXPLANATION OF SYMBOLS 1. substrate
2. particle
3. particle holding layer
4. soluble solute (B)
5. remover
6. trace of elution of soluble solute (B)
7. crack

The invention claimed is:

1. A method for manufacturing a cleaned substrate, comprising:
   (1) dripping the substrate cleaning solution comprising: an insoluble or hardly soluble solute (A), a soluble solute (B), and a solvent (C):
   wherein
   the solvent (C) comprises water (C-1) and an organic solvent (C-2);
   the content of the soluble solute (B) is 0.1 to 500 mass % based on the water (C-1); and
   the content of water (C-1) is 0.01 to 50 mass % based on the solvent (C);
   and wherein
   the insoluble or hardly soluble solute (A) comprises at least one of novolak derivatives, phenol derivatives, polystyrene derivatives, polyacrylate derivatives, poly-maleic acid derivatives, polycarbonate derivatives, polyvinyl alcohol derivatives, polymethacrylate derivatives, and copolymer of any combination of any of these,
   and wherein
   the soluble solute (B) comprises a structural unit represented by the formula (B-1):

$$(B-1)$$

where
   $L_1$ is a linker selected from at least one of a single bond, $C_{1-4}$ alkylene, phenylene, ether, carbonyl, amide, and imide,
   $R_1$ is carboxyl, sulfo, or phosphor,
   $R_2$ is hydrogen, methyl, or carboxyl, and
   $R_3$ is hydrogen or methyl;
   and wherein
   the soluble solute (B) is a compound comprising carboxyl, sulfo, or phospho: and the acid dissociation constant pKa ($H_2O$) of the soluble solute (B) is −5 to 11, on a substrate;
   (2) removing at least a part of the solvent (C) to form a film;
   (3) making the film hold particles on the substrate; and
   (4) applying a remover on the substrate to remove the film holding particles.

2. The method for manufacturing a cleaned substrate according to claim 1, comprising at least one of the following steps:
   (0-1) processing the substrate by etching to form a pattern and removing an etching mask;
   (0-2) cleaning the substrate;
   (0-3) prewetting the substrate;
   (0-4) cleaning the substrate;
   (5) dripping water or an organic solvent on the substrate after the removal of the film in which particles are held and removing water or the organic solvent to clean the substrate further.

3. The method for manufacturing a cleaned substrate according to claim 1, wherein the step (2) is carried out by spin-drying the substrate:
   the spin-dry is carried out at 500 to 3,000 rpm for 0.5 to 90 seconds and/or the substrate is a disk shape substrate and has a diameter of 200 to 600 nm.

4. The method for manufacturing a cleaned substrate according to claim 1, wherein the substrate is a non-processed substrate or processed substrate, wherein the surface of the substrate is a semiconductor, and/or
   the surface of the substrate is selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TIN, SiCN, NON, Cu, Ta, W, Hf, Al, Ru, Co and amorphous carbon.

5. The method for manufacturing a cleaned substrate according to claim 4, comprising at least one of the following steps:
   (0-1) processing the substrate by etching to form a pattern and removing an etching mask;

(0-2) cleaning the substrate;

(0-3) prewetting the substrate;

(0-4) cleaning the substrate;

(5) dripping water or an organic solvent on the substrate after the removal of the film in which particles are held and removing water or the organic solvent to clean the substrate further.

6. A substrate cleaning solution comprising an insoluble or hardly soluble solute (A), a soluble solute (B), and a solvent (C):

wherein the solvent (C) comprises water (C-1) and an organic solvent (C-2);

the content of the soluble solute (B) is 0.1 to 500 mass % based on the water (C-1); and the content of water (C-1) is 0.01 to 50 mass % based on the solvent (C);

and wherein the insoluble or hardly soluble solute (A) comprises at least one of novolak derivatives, phenol derivatives, polystyrene derivatives, polyacrylate derivatives, polymaleic acid derivatives, polycarbonate derivatives, polyvinyl alcohol derivatives, polymethacrylate derivatives, and copolymer of any combination of any of these, and wherein the soluble solute (B) comprises a structural unit represented by the formula (B-1):

$$(B-1)$$

where $L_1$ is a linker selected from at least one of a single bond, $C_{1-4}$ alkylene, phenylene, ether, carbonyl, amide, and imide, $R_1$ is carboxyl, sulfo, or phosphor, $R_2$ is hydrogen, methyl, or carboxyl, and $R_3$ is hydrogen or methyl;

and wherein the soluble solute (B) is a compound comprising carboxyl, sulfo, or phosphor; and the acid dissociation constant pKa ($H_2O$) of the soluble solute (B) is −5 to 11;

wherein the weight average molecular weight ($M_w$) of the soluble solute (B) is 500 to 500,000;

the substrate cleaning solution is dripped on a substrate and dried to remove at least a part of the solvent (C) to form a film, the film being then removed from the substrate by a remover.

7. The substrate cleaning solution according to claim 6, wherein the insoluble or hardly soluble solute (A) is insoluble or hardly insoluble by the remover; and/or the soluble solute (B) is soluble by the remover.

8. The substrate cleaning solution according to claim 6, wherein the solvent (C) comprises an organic solvent (C-2) which has volatility; and/or the boiling point of the organic solvent (C-2) at one atmospheric pressure is 50 to 250° C.

9. The substrate cleaning solution according to claim 6, wherein the solubility of the insoluble or hardly soluble solute (A) in 5.0 mass % ammonia water is less than 100 ppm, and the solubility of the soluble solute (B) in 5.0 mass % ammonia water is 100 ppm or more.

10. The substrate cleaning solution according to claim 6, wherein the content of the insoluble or hardly soluble solute (A) is 0.1 to 50 mass % based on the substrate cleaning solution;

the content of the soluble solute (B) is 1 to 100 mass % based on the insoluble or hardly soluble solute (A); and/or the content of the solvent (C) is 0.1 to 99.9 mass based on the substrate cleaning solution.

11. The substrate cleaning solution according to claim 6, wherein the weight-average molecular weight ($M_w$) of the insoluble or hardly soluble solute (A) is 150 to 500,000.

12. The substrate cleaning solution according to claim 6, further comprising a further additive (D), wherein the further additive (D) comprises a surfactant, an acid, a base, an antibacterial agent, a germicide, an antiseptic, or an antifungal agent, and the content of the further additive (D) is present in an amount up to 100 mass % based on the insoluble or hardly soluble solute (A).

13. The substrate cleaning solution according to claim 6, further comprising a further additive (D), wherein the further additive (D) comprises a surfactant, an acid, a base, an antibacterial agent, a germicide, an antiseptic, or an antifungal agent, and the content of the further additive (D) is present in an amount up to 10 mass % based on the insoluble or hardly soluble solute (A).

14. The substrate cleaning solution according to claim 6, wherein the weight-average molecular weight ($M_w$) of the soluble solute (B) is 15,000.

15. The substrate cleaning solution according to claim 6, wherein the soluble solute (B) is a crack accelerating component (B'), where the crack accelerating component (B') comprises hydrocarbon comprising carboxyl.

16. The substrate cleaning solution according to claim 15, wherein the insoluble or hardly soluble solute (A) does not contain fluorine and/or silicon.

* * * * *